(12) United States Patent
Wang et al.

(10) Patent No.: US 9,496,256 B2
(45) Date of Patent: Nov. 15, 2016

(54) SEMICONDUCTOR DEVICE INCLUDING A VERTICAL GATE-ALL-AROUND TRANSISTOR AND A PLANAR TRANSISTOR

(71) Applicant: Taiwan Semiconductor Manufacturing Company Limited, Hsinchu (TW)

(72) Inventors: Chin-Chi Wang, New Taipei (TW); Wu-Ping Huang, Hsinchu County (TW); Wun-Jie Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/334,719

(22) Filed: Jul. 18, 2014

(65) Prior Publication Data

US 2016/0020206 A1 Jan. 21, 2016

(51) Int. Cl.
*H01L 27/088* (2006.01)
*H01L 29/78* (2006.01)
*H01L 29/423* (2006.01)
*H01L 29/417* (2006.01)
*H01L 21/8234* (2006.01)
*H01L 21/28* (2006.01)

(52) U.S. Cl.
CPC ....... *H01L 27/088* (2013.01); *H01L 21/28114* (2013.01); *H01L 21/823456* (2013.01); *H01L 21/823462* (2013.01); *H01L 21/823487* (2013.01); *H01L 29/4175* (2013.01); *H01L 29/41741* (2013.01); *H01L 29/42364* (2013.01); *H01L 29/42376* (2013.01); *H01L 29/78* (2013.01); *H01L 29/7827* (2013.01)

(58) Field of Classification Search
USPC ....................................................... 257/329
See application file for complete search history.

(56) References Cited

U.S. PATENT DOCUMENTS

| | | | | |
|---|---|---|---|---|
| 7,364,997 B2* | 4/2008 | Juengling | ......... | H01L 21/76819 257/302 |
| 8,742,492 B2* | 6/2014 | Chuang | ............. | H01L 21/28114 257/329 |
| 2005/0215022 A1* | 9/2005 | Adam | ................. | H01L 21/2822 438/369 |
| 2006/0278921 A1* | 12/2006 | Pellizzer | ............. | H01L 27/2454 257/328 |
| 2007/0252196 A1* | 11/2007 | Kim | ................ | H01L 21/823842 257/329 |
| 2010/0197121 A1* | 8/2010 | Kim | ................... | H01L 27/10817 438/486 |
| 2010/0203695 A1* | 8/2010 | Oh | .......................... | H01L 21/84 438/270 |
| 2011/0253981 A1* | 10/2011 | Rooyackers | ........... | B82Y 10/00 257/24 |
| 2011/0254098 A1* | 10/2011 | Wong | ................ | H01L 21/28123 257/369 |
| 2012/0132986 A1* | 5/2012 | Kang | ............. | H01L 21/823487 257/329 |
| 2012/0292688 A1* | 11/2012 | Kwon | ................... | H01L 27/088 257/329 |
| 2012/0319201 A1* | 12/2012 | Sun | ................. | H01L 21/823487 257/338 |
| 2013/0062673 A1* | 3/2013 | Masuoka | .......... | H01L 27/14616 257/291 |
| 2014/0061775 A1* | 3/2014 | Chuang | ........... | H01L 21/823814 257/329 |
| 2014/0131810 A1* | 5/2014 | Masuoka | ........ | H01L 21/823487 257/369 |
| 2015/0206588 A1* | 7/2015 | Masuoka | ............... | G11C 16/08 257/329 |

* cited by examiner

*Primary Examiner* — Marc Armand
*Assistant Examiner* — Younes Boulghassoul
(74) *Attorney, Agent, or Firm* — Jones Day

(57) ABSTRACT

A semiconductor device includes a first transistor and a second transistor. Each of the first and second transistors includes a channel. The channel of the first transistor extends in a substantially vertical direction. The channel of the second transistor extends in a substantially horizontal direction. A method for fabricating the semiconductor device is also disclosed.

9 Claims, 13 Drawing Sheets

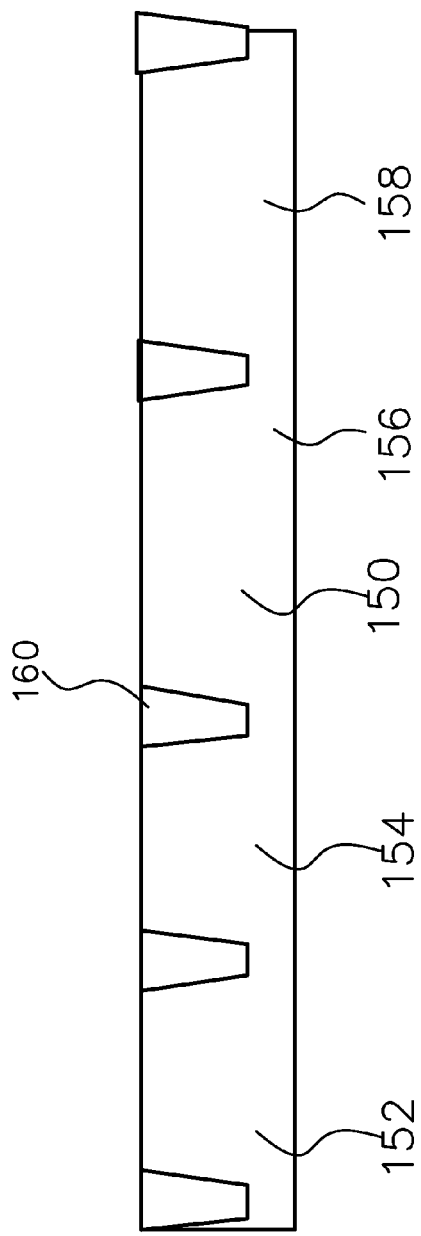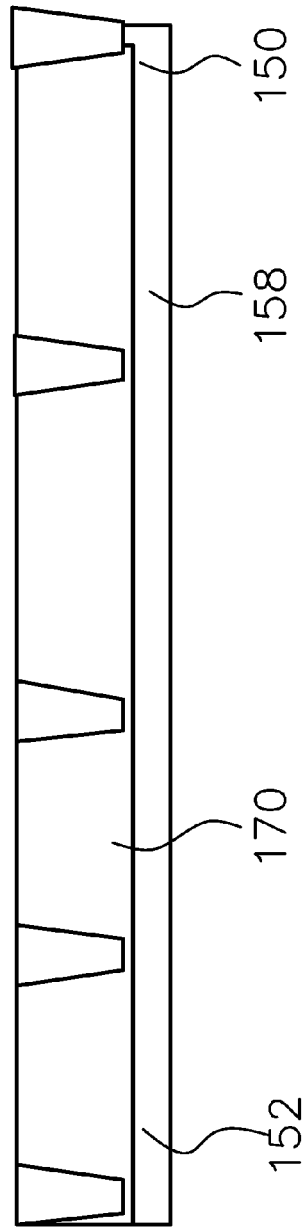

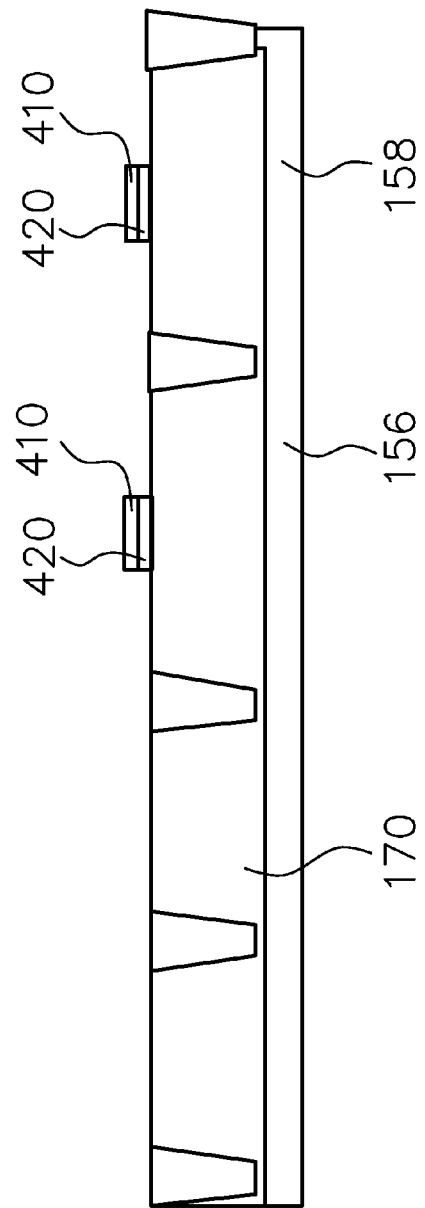
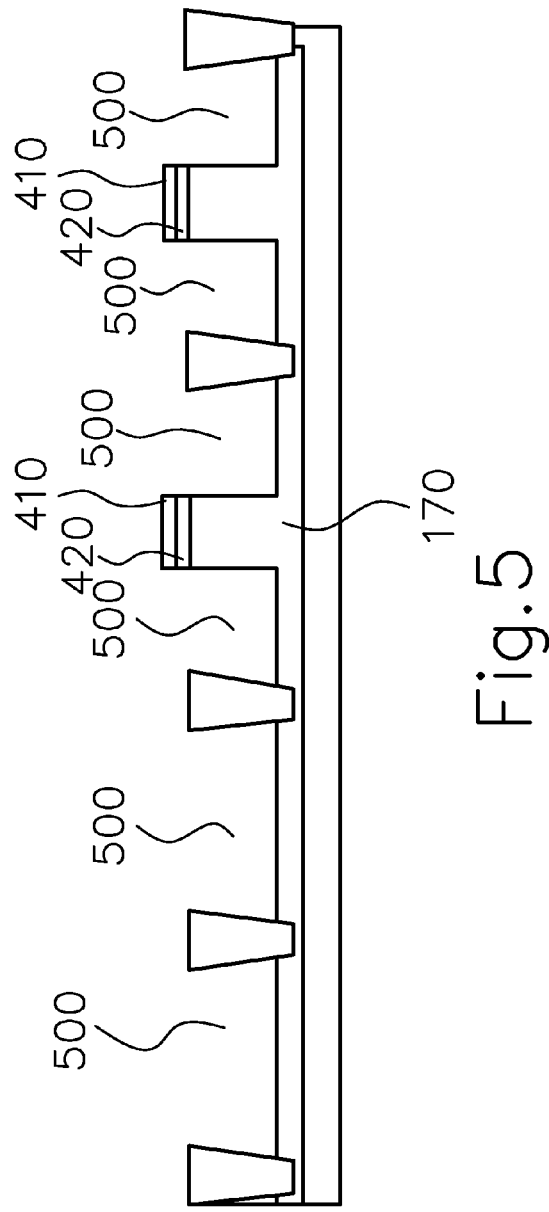

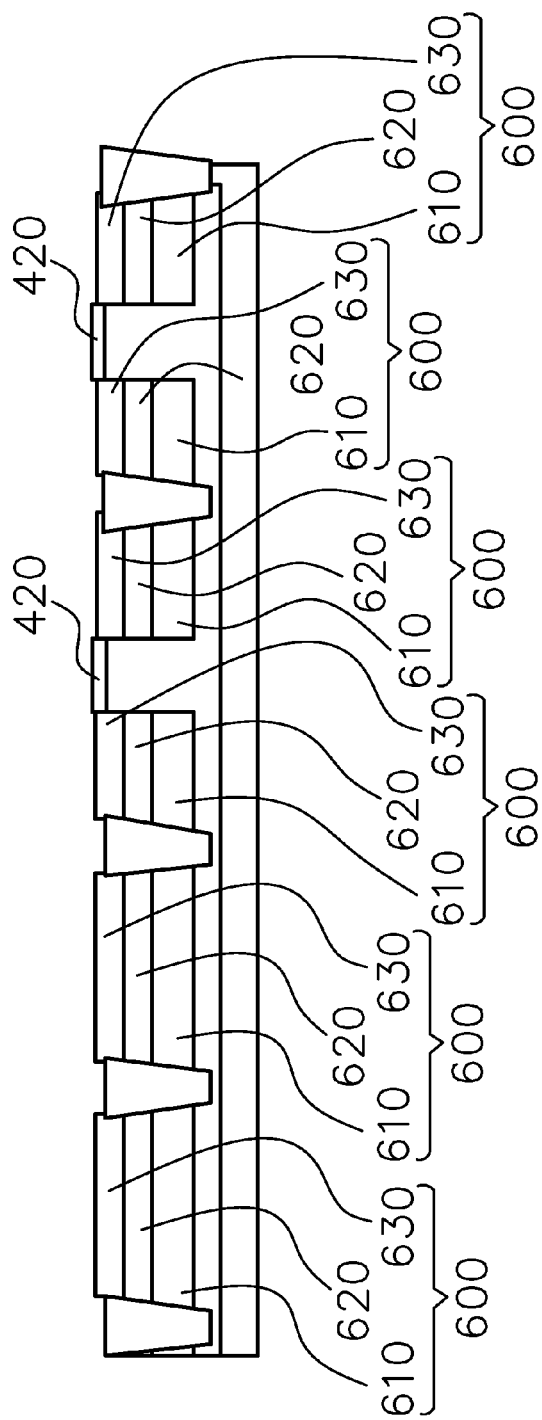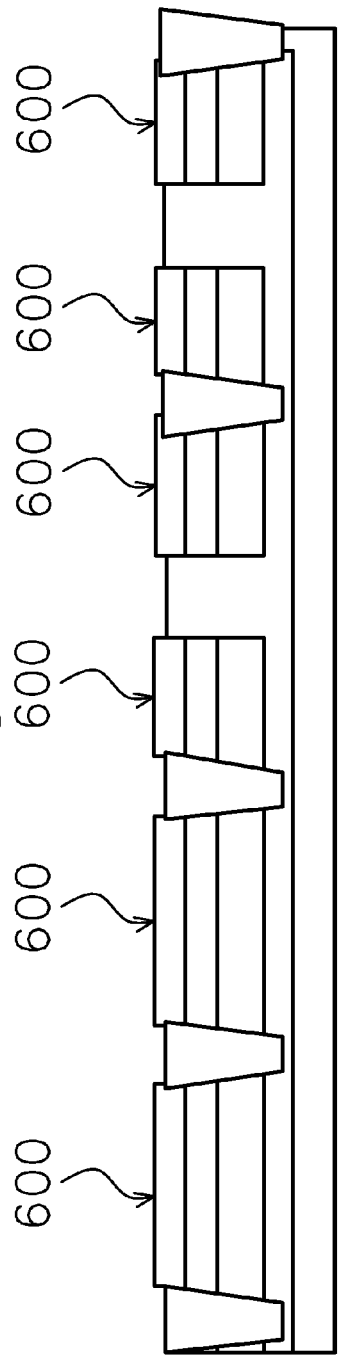

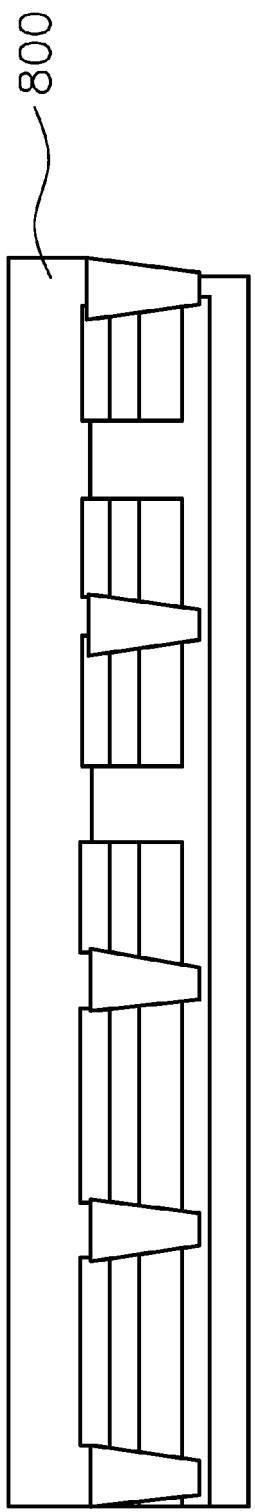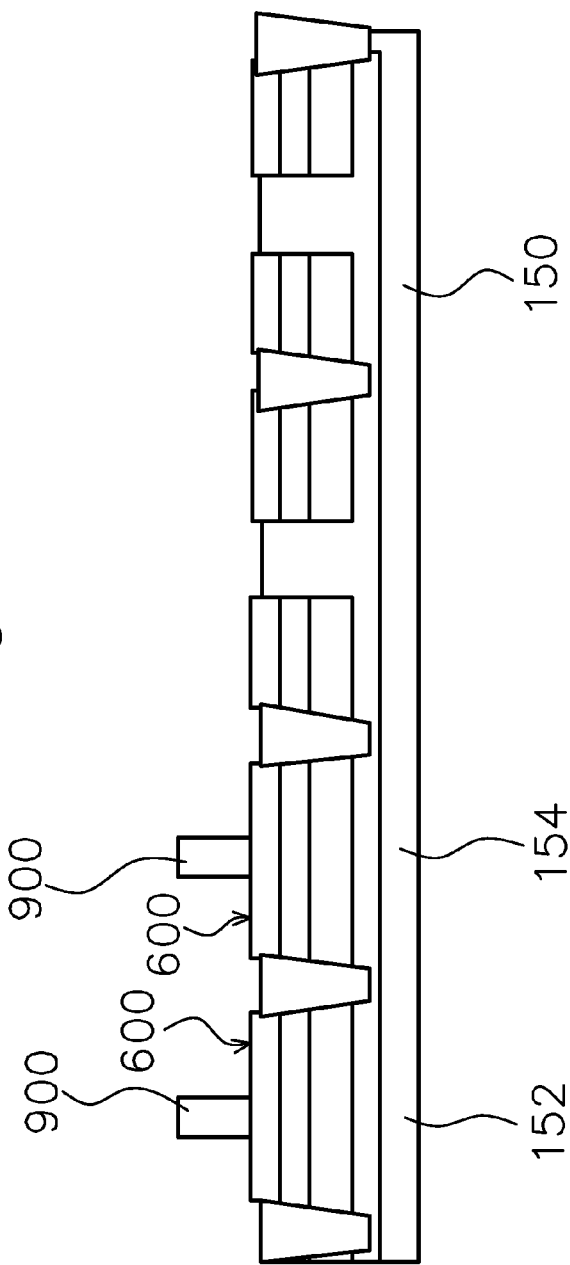

SEMICONDUCTOR DEVICE INCLUDING A VERTICAL GATE-ALL-AROUND TRANSISTOR AND A PLANAR TRANSISTOR

BACKGROUND

The present disclosure relates to a semiconductor device, more particularly to a semiconductor device that includes a vertical gate-all-around transistor (VGAA) and a planar transistor.

A VGAA transistor includes a channel that extends in a vertical direction and that interconnects a source and a drain thereof, a gate oxide that surrounds the channel, and a gate that surrounds the gate oxide. The VGAA transistor may be implemented in a semiconductor device as a core transistor for forming a logic circuit, or as an input/output (I/O) transistor for forming an I/O circuit coupled electrically to external circuits.

When used as an I/O transistor, the gate oxide of the VGAA I/O transistor is made thick in order to sustain a high voltage, e.g., an electrostatic discharge (ESD)-induced voltage, applied thereto by the external circuits. However, the VGAA I/O transistor is still susceptible to ESD-induced damages.

When used as a core transistor, the gate oxide of the VGAA core transistor is made thin in order to increase a gate input capacitance thereof. However, the VGAA core transistor still has an insufficient gate input capacitance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-21 are schematic sectional views of a semiconductor device at various stages of fabrication, in accordance with some embodiments.

DETAILED DESCRIPTION

Figure 1:
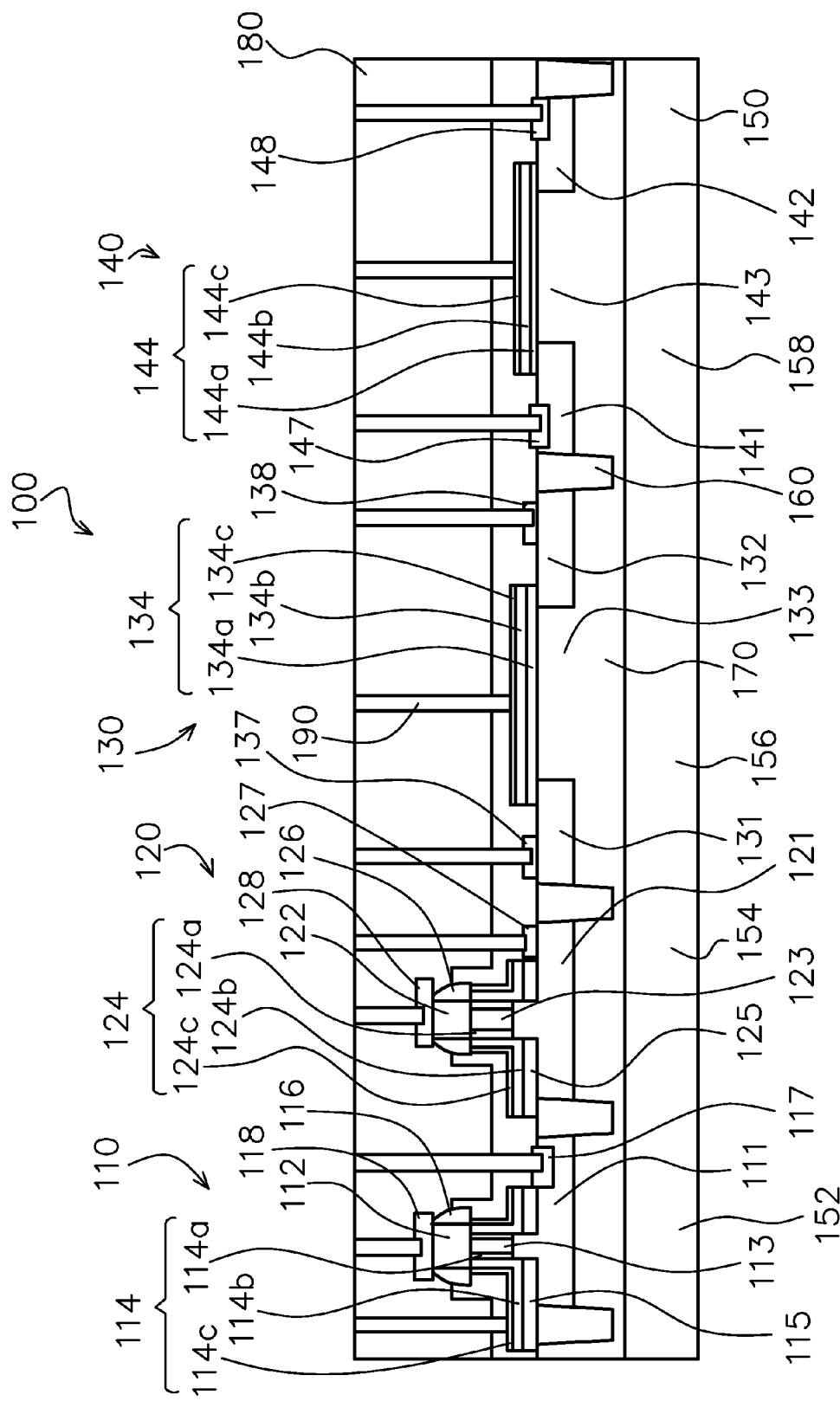
FIG. 1 is a sectional view of the exemplary embodiment of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underneath," "below," "lower," "above," "on," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, the exemplary embodiment of a semiconductor device 100 according to the present disclosure includes a first transistor 110, a second transistor 120, a third transistor 130, and a fourth transistor 140.

The example semiconductor device 100 further includes a substrate 150 that is divided by a plurality of isolation regions 160, such as shallow trench isolation (STI) regions or any other suitable isolation regions, into a first active region 152, a second active region 154, a third active region 156, and a fourth active region 158. The first, second, third, and fourth active regions 152, 154, 156, 158 of the substrate 150 are spaced apart from each other in a substantially horizontal direction, and are sequentially arranged from left to right of the substrate 150.

The example semiconductor device 100 further includes a well 170 that is formed in the substrate 150 and that spans from the first active region 152 to the fourth active region 158 of the substrate 150. In this embodiment, the well 170 is a P conductivity type well.

The first transistor 110 is disposed in the first active region 152 of the substrate 150, and includes a first source/drain (S/D) 111, a second S/D 112, a channel 113, and a gate stack 114. The first S/D 111 has a generally inverted-T cross-sectional shape along a substantially vertical plane, and includes a first end portion formed in the well 170, and a second end portion. The channel 113 extends in a substantially vertical direction, and interconnects the second end portion of the first S/D 111 and the second S/D 112. In this embodiment, the first S/D 111 and the second S/D 112 are a source and a drain, respectively. In an alternative embodiment, the first S/D 111 may be a drain, and in such an embodiment, the second S/D 112 is a source.

The gate stack 114 includes a gate oxide 114a, a high-K dielectric 114b, and a gate 114c. The gate oxide 114a surrounds the channel 113. The high-K dielectric 114b includes a vertical portion that surrounds the gate oxide 114a, and a horizontal portion that surrounds the gate oxide 114a. The gate 114c includes a vertical portion that surrounds the vertical portion of the high-K dielectric 114b, and a horizontal portion that surrounds the vertical portion of the high-K dielectric 114b and that is disposed on the horizontal portion of the high-K dielectric 114b.

Since the channel 113 of the first transistor 110 extends in the vertical direction and is surrounded by the gate stack 114 of the first transistor 110, the first transistor 110 may be referred to as a vertical gate-all-around (VGAA) transistor.

The first transistor 110 further includes a first spacer 115 and a second spacer 116. The first spacer 115 is sandwiched between the first end portion of the source 111 and the horizontal portion of the high-K dielectric 114b and surrounds the second end portion of the source 111. The second spacer 116 surrounds the drain 112.

The first transistor 110 further includes a source silicide 117 provided on the first end portion of the source 111, and a drain silicide 118 provided on the drain 112.

The second transistor 120 is disposed in the second active region 154 of the substrate 150, and includes a first S/D 121, a second S/D 122, a channel 123, and a gate stack 124. The first S/D 121 has a generally inverted-T cross-sectional shape along the vertical plane, and includes a first end portion that is formed in the well 170, and a second end portion. The channel 123 extends in the vertical direction and interconnects the second end portion of the first S/D 121 and the second S/D 122. In this embodiment, the first S/D 121 and the second S/D 122 are a source and a drain, respectively. In an alternative embodiment, the first S/D 121 may be a drain, and in such an embodiment, the second S/D 122 is a source.

The gate stack 124 includes a gate oxide 124a, a high-K dielectric 124b, and a gate 124c. The gate oxide 124a surrounds the channel 123. The high-K dielectric 124b includes a vertical portion that surrounds the gate oxide 124a, and a horizontal portion that surrounds the gate oxide 124a. The gate 124c includes a vertical portion that surrounds the vertical portion of the high-K dielectric 124b, and a horizontal portion that surrounds the vertical portion of the high-K dielectric 124b and that is disposed on the horizontal portion of the high-K dielectric 124b.

Since the channel 123 of the second transistor 120 extends in the vertical direction and is surrounded by the gate stack 124 of the second transistor 120, the second transistor 120, as in the case of the first transistor 110, may be referred to as a VGAA transistor.

In an example embodiment, the channels 113, 123 and the gate oxides 114a, 124a of the gate stacks 114, 124 of the first and second transistors 110, 120 have a substantially same length.

In some embodiments, the vertical portions of the gates 114c, 124c of the gate stacks 114, 124 of the first and second transistors 110, 120 have a substantially same length. In other embodiments, the vertical portions of the gates 114c, 124c of the gate stacks 114, 124 of the first and second transistors 110, 120 have different lengths.

In this embodiment, the gate oxide 124a of the gate stack 124 of the second transistor 120 has a thickness greater than that of the gate oxide 114a of the gate stack 114 of the first transistor 110. Thus, the first and second transistors 110, 120 may be configured as core and input/output (I/O) transistors, respectively.

The second transistor 120 further includes a first spacer 125 and a second spacer 126. The first spacer 125 is sandwiched between the first end portion of the source 121 and the horizontal portion of the high-K dielectric 124b and surrounds the second end portion of the source 121. The second spacer 126 surrounds the drain 122.

The second transistor 120 further includes a source silicide 127 provided on the first end portion of the source 121, and a drain silicide 128 provided on the drain 122.

The third transistor 130 is disposed in the third active region 156 of the substrate 150, and includes a first S/D 131, a second S/D 132, a channel 133, and a gate stack 134. The first S/D 131 and the second S/D 132 are disposed in left and right end portions of the well 170 in the third active region 156 of the substrate 150, respectively. The channel 133 extends in the horizontal direction and interconnects the first S/D 131 and the second S/D 132. In this embodiment, the first S/D 131 and the second S/D 132 are a source and a drain, respectively. In an alternative embodiment, the first S/D 131 may be a drain, and in such an embodiment, the second S/D 132 is a source.

The gate stack 134 includes a gate oxide 134a, a high-K dielectric 134b, and a gate 134c. The gate oxide 134a extends in the horizontal direction, and has a first end portion that is disposed on the source 131, a second end portion that is disposed on the drain 132, and an intermediate portion that extends between the first and second end portions thereof and that is disposed on the channel 133. The high-K dielectric 134b extends in the horizontal direction and is disposed on the gate oxide 134a. The gate 134c extends in the horizontal direction and is disposed on the high-K dielectric 134b.

Since the channel 133 of the third transistor 130 extends in the horizontal direction, and since the gate stack 134 of the third transistor 130 is disposed on the channel 133 of the third transistor 130, the third transistor 130 may be referred to as a planar transistor.

In an example embodiment, the gate oxide 134a, the high-K dielectric 134b, and the gate 134c of the gate stack 134 of the third transistor 130 have a substantially same length.

In this embodiment, the gate oxide 134a of the gate stack 134 of the third transistor 130 has a substantially same thickness as the gate oxide 124a of the gate stack 124 of the second transistor 120. In addition, the gate oxide 134a of the gate stack 134 of the third transistor 130 has a length greater than that of the gate oxide 124a of the gate stack 124 of the second transistor 120. Thus, the third transistor 130 may be configured as an electrostatic discharge (ESD) protection circuit for the second transistor 120.

The third transistor 130 further includes a source silicide 137 and a drain silicides 138 provided on the source 131 and the drain 132, respectively.

The fourth transistor 140 is disposed in the fourth active region 158 of the substrate 150, and includes a first S/D 141, a second S/D 142, a channel 143, and a gate stack 144. The first S/D 141 and the second S/D 142 are disposed in left and right end portions of the well 170 in the fourth active region 158 of the substrate 150, respectively. The channel 143 extends in the horizontal direction and interconnects the first S/D 141 and the second S/D 142. In this embodiment, the first S/D 141 and the second S/D 142 are a source and a drain, respectively. In an alternative embodiment, the first S/D 141 may be a drain, and in such an embodiment, the second S/D 142 is a source.

The gate stack 144 includes a gate oxide 144a, a high-K dielectric 144b, and a gate 144c. The gate oxide 144a extends in the horizontal direction, and has a first end portion that is disposed on the source 141, a second end portion that is disposed on the drain 142, and an intermediate portion that extends between the first and second end portions thereof and that is disposed on the channel 143. The high-K dielectric 144b extends in the horizontal direction and is disposed on the gate oxide 144a. The gate 144c extends in the horizontal direction and is disposed on the high-K dielectric 144b.

Since the channel 143 of the fourth transistor 140 extends in the horizontal direction, and since the gate stack 144 of the fourth transistor 140 is disposed on the channel 143 of the fourth transistor 140, the fourth transistor 140 may be referred to as a planar transistor, as in the case of the third transistor 130.

In an example embodiment, the gate oxide 144a, the high-K dielectric 144b, and the gate 144c of the gate stack 144 of the fourth transistor 140 have a substantially same length.

In this embodiment, the gate oxide 144a of the gate stack 144 of the fourth transistor 140 has a substantially same thickness as the gate oxide 114a of the gate stack 114 of the first transistor 110. In addition, the gate oxide 144a of the gate stack 144 of the fourth transistor 140 has a length greater than that of the gate oxide 114a of the gate stack 114 of the first transistor 110. Thus, the fourth transistor 140 may be configured as a capacitor circuit for the first transistor 110.

The fourth transistor 140 further includes a source silicide 147 and a drain silicide 148 provided on the source 141 and the drain 142, respectively.

In an example embodiment, the sources 111, 121 of the first and second transistors 110, 120, and the sources 131, 141 and the drains 132, 142 of the third and fourth transistors 130, 140 lie in a substantially same horizontal plane. In another example embodiment, the first end portions of the sources 111, 121 of the first and second transistors 110, 120 and the sources 131, 141 and the drains 132, 142 of the third and fourth transistors 130, 140 have a substantially same thickness. In yet another example embodiment, the second end portions of the sources 111, 121 of the first and second transistors 110, 120 have a substantially same thickness. In a further example embodiment, the drains 112, 122 of the first and second transistors 110, 120 have a substantially same thickness.

In some embodiments, the high-K dielectrics 114b, 124b, 134b, 144b of the gate stacks 114, 124, 134, 144 of the first, second, third, and fourth transistors 110, 120, 130, 140 have a substantially same thickness.

In other embodiments, the gates 114c, 124c, 134c, 144c of the gate stacks 114, 124, 134, 144 of the first, second, third, and fourth transistors 110, 120, 130, 140 have a substantially same thickness.

In this embodiment, the first, second, third, and fourth transistors 110, 120, 130, 140 are an N-channel transistor. In an alternative embodiment, the first, second, third, and fourth transistors 110, 120, 130, 140 are a P-channel transistor. In such an alternative embodiment, the well 170 is an N conductivity type well.

The semiconductor device 100 further includes an insulation 180 and a plurality of contacts 190. The insulation 180 covers the first, second, third, and fourth transistors 110, 120, 130, 140. Each of the contacts 190 extends through the insulation 180 and is connected electrically to a respective one of the source silicides 117, 127, 137, 147, the drain silicides 118, 128, 138, 148, and the gates 114c, 124c, 134c, 144c (the contact 190 for the gate 124c is not shown in FIG. 1).

Figure 22:
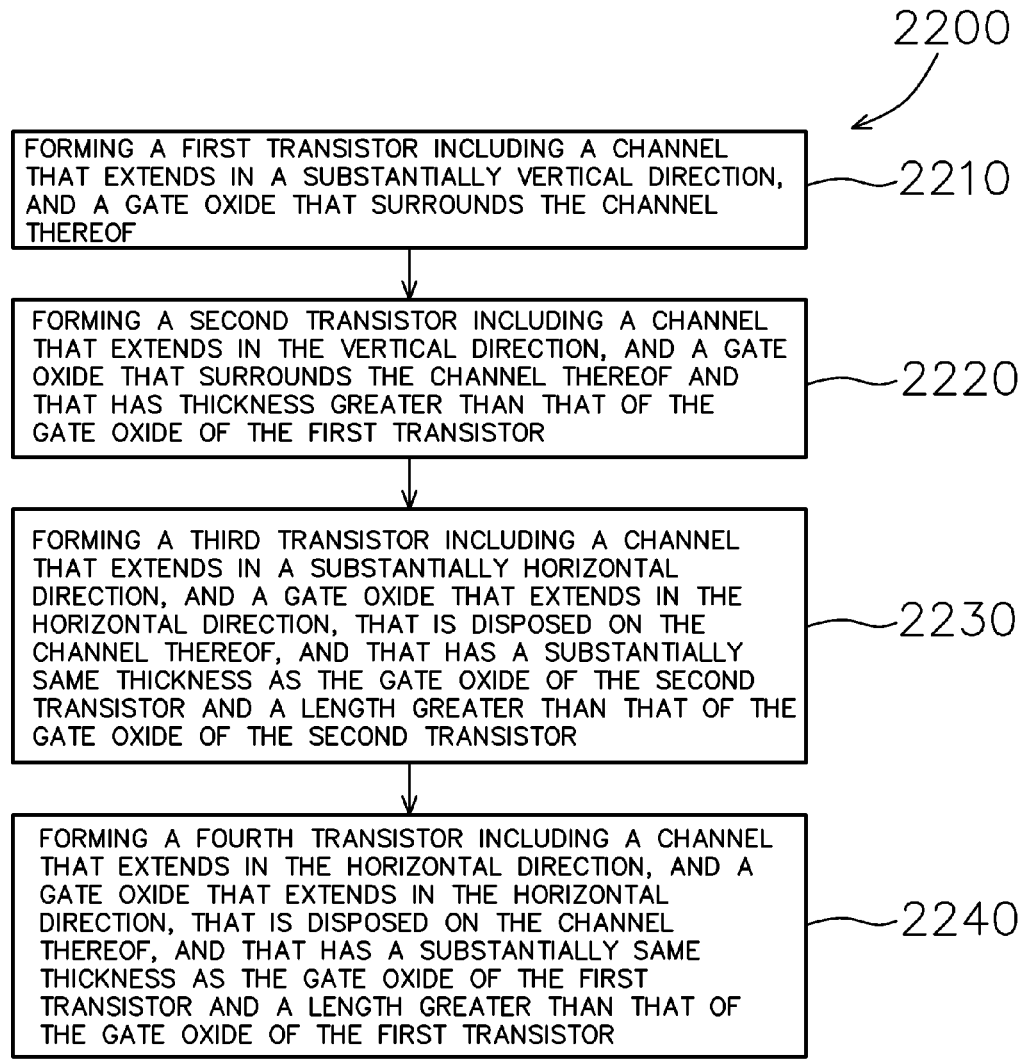
FIG. 22 is a flowchart illustrating a method for fabricating a semiconductor device, in accordance with some embodiments.

Referring to FIG. 22, the exemplary method 2200 for fabricating the semiconductor device 100 according to the present disclosure begins with block 2210 in which a first transistor is formed. The first transistor includes a channel that extends in a substantially vertical direction and a gate oxide that surrounds the channel thereof. The method 2200 continues with block 2220 in which a second transistor is formed. The second transistor includes a channel that extends in the vertical direction, and a gate oxide that surrounds the channel thereof and that has a thickness greater than that of the gate oxide of the first transistor. The method 2200 continues with block 2230 in which a third transistor is formed. The third transistor includes a channel that extends in a substantially horizontal direction, and a gate oxide that extends in the horizontal direction, that is disposed on the channel thereof, that has a substantially same thickness as the gate oxide of the second transistor, and that has a length greater than that of the gate oxide of the second transistor. The method 2200 continues with block 2240 in which a fourth transistor is formed. The fourth transistor includes a channel that extends in the horizontal direction, and a gate oxide that extends in the horizontal direction, that is disposed on the channel thereof, that has a substantially same thickness as the gate oxide of the first transistor, and that has a length greater than that of the gate oxide of the first transistor.

FIGS. 2-21 illustrate the sequence of operations in the fabrication of the semiconductor device 100 according to the method 2200 of FIG. 22.

First, referring to FIG. 2, the substrate 150 is provided, after which the isolation regions 160 are formed in the substrate 150 to thereby divide the substrate 150 into the first, second, third, and fourth active regions 152, 154, 156, 158. In this embodiment, each of the isolation regions 160 may be formed using an STI process or any other suitable process. The first, second, third, and fourth active regions 152, 154, 156, 158 of the substrate 150 are spaced apart from each other in a substantially horizontal direction, and are sequentially arranged from left to right of the substrate 150.

Next, referring to FIG. 3, the well 170 is formed, such as by an implantation or diffusion process, in the substrate 150. The well 170 extends from the first active region 152 to the fourth active region 158 of the substrate 150.

After forming the well 170, a hard mask layer is formed over the structure of FIG. 3, after which a photo-sensitive layer is formed on the hard mask layer. Thereafter, the photo-sensitive layer is patterned, and is then etched, as well as the hard mask layer thereunder, such that, as best shown in FIG. 4, the remaining photo-sensitive layer 410, as well as the remaining the hard mask layer 420 thereunder, covers a middle portion of the well 170 in the third active region 156 of the substrate 150 which will become the channel 133 of the third transistor 130, and further covers a middle portion of the well 170 in the fourth active region 158 of the substrate 150 which will become the channel 143 of the fourth transistor 140.

In FIG. 5, using the remaining photo-sensitive layer 410 as a mask, exposed portions of the well 170 are removed, such as by an etching process, to form recesses 500 in the well 170. In this embodiment, the recesses 500 have a substantially same depth. Next, the remaining photo-sensitive layer 410 is removed.

Next, referring to FIG. 6, an epitaxially grown layer unit 600 is formed in each of the recesses 500. Each of the epitaxially grown layer units 600 includes a first epitaxially grown layer 610 formed on the well 170 in a respective one of the recesses 500 using a first epitaxial growth process, a second epitaxially grown layer 620 formed on the first epitaxially grown layer 610 using a second epitaxial growth process, and a third epitaxially grown layer 630 formed on the second epitaxially grown layer 620 using a third epitaxial growth process.

In this embodiment, the first, second, and third epitaxial growth processes are sequentially performed in-situ. That is, the first, second, and third epitaxial growth processes may be carried out without a vacuum break in constituent process chambers.

In an alternative embodiment, the first, second, and third epitaxial growth processes are performed ex-situ. For example, a top surface of the first epitaxially grown layer 610 may be cleaned prior to the formation of the second epitaxially grown layer 620 thereon, and a top surface of the second epitaxially grown layer 620 may be cleaned prior to the formation of the third epitaxially grown layer 630 thereon.

Moreover, in this embodiment, the well 170 is doped with a P-type dopant, and the epitaxially grown layer units 600 are doped with an N-type dopant. Further, in this embodiment, the first and third epitaxially grown layers 610, 630 are doped with a higher concentration of the N-type dopant than the second epitaxially grown layers 620.

In an alternative embodiment, the well 170 may be doped with an N-type dopant. In such an alternative embodiment, the epitaxially grown layer units 600 are doped with a P-type dopant, and the first and third epitaxially grown layers 610, 630 are doped with a higher concentration of the P-type dopant than the second epitaxially grown layers 620.

After forming the epitaxially grown layer units 600, the remaining hard mask layer 420 is removed from the structure of FIG. 6, such as by an etching process, thereby resulting in the structure shown in FIG. 7.

In FIG. 8, a hard mask layer 800 is formed over the structure of FIG. 7. Thereafter, the hard mask layer 800 is patterned and etched such that, as best shown in FIG. 9, the remaining hard mask layer 900 covers a middle portion of the epitaxially grown layer unit 600 in the first active region 152 of the substrate 150, and further covers a middle portion of the epitaxially grown layer unit 600 in the second active region 154 of the substrate 150.

Figure 10:
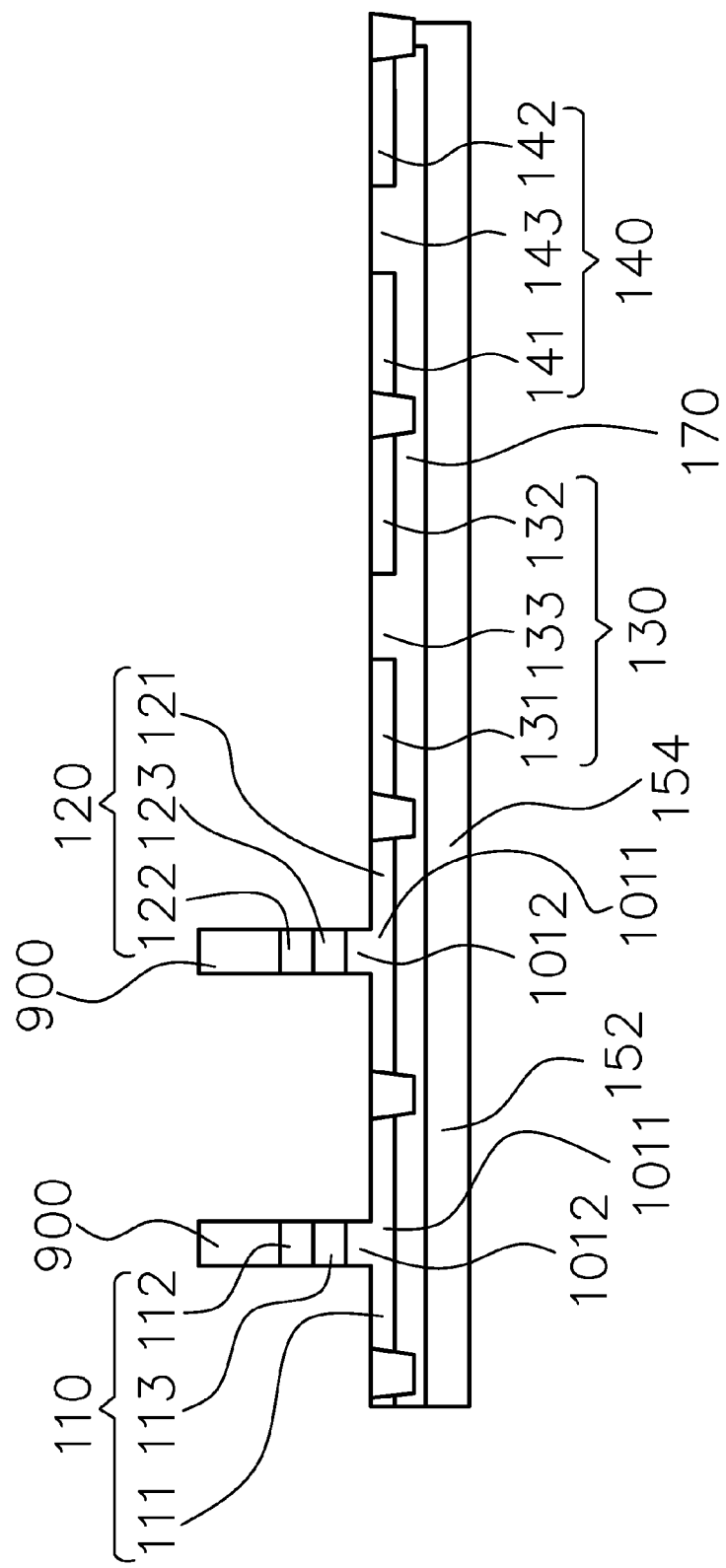
Figure 11:
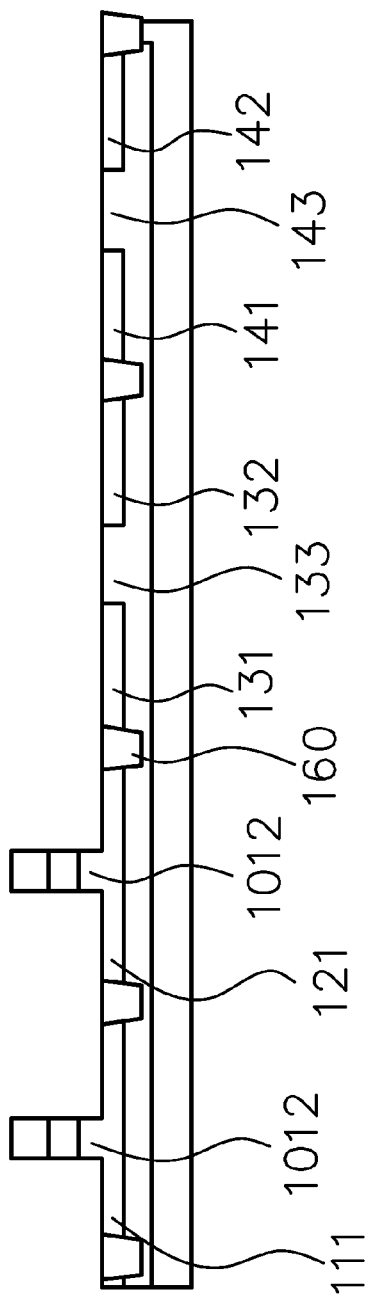

Next, using the remaining hard mask layer 900 as a mask, exposed portions of the epitaxially grown layer units 600 are removed, such as by an etching process, to simultaneously form: the source 111, the drain 112, and the channel 113 of the first transistor 110; the source 121, the drain 122, and the channel 123 of the second transistor 120; the source 131, the drain 132, and the channel 133 of the third transistor 130; and the source 141, the drain 142, and the channel 143 of the fourth transistor 140, as illustrated in FIG. 10.

In this embodiment, each of the sources 111, 121 has a generally inverted-T cross-sectional shape along a substantially vertical plane, and includes a first end portion 1011 formed in the well 170 in a respective one of the first and second active regions 152, 154 of the substrate 150, and a second end portion 1012. Next, the remaining hard mask layer 900 is removed, thereby resulting in the structure shown in FIG. 11.

Figure 12:
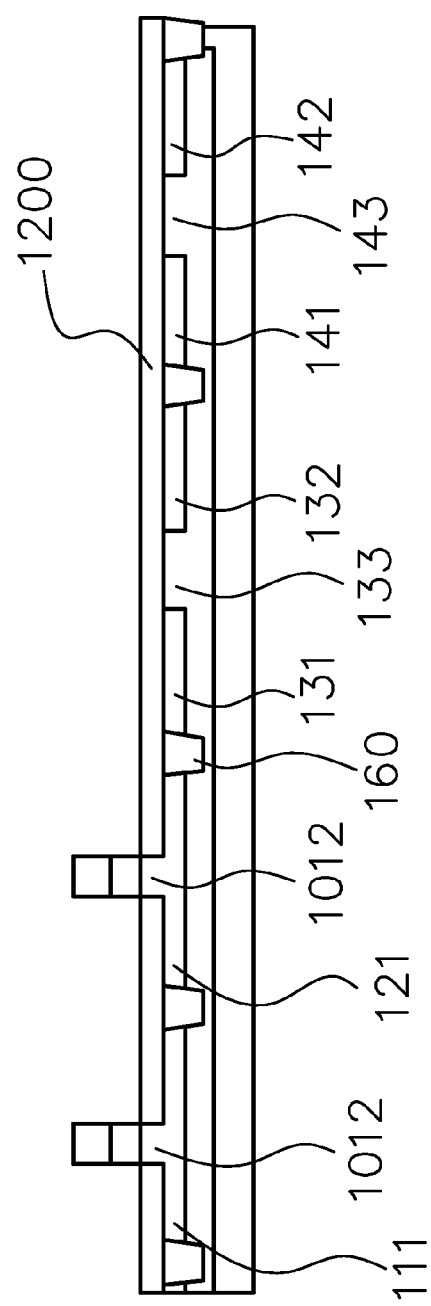

In FIG. 12, a first spacer material 1200 is formed on the sources 111, 121, 131, 141, the drains 132, 142, the channels 133, 143, and the isolation regions 160 to a substantially same thickness as that of the second end portions 1012 of the sources 111, 121. Next referring to FIG. 13, an inter-layer dielectric (ILD) layer 1300 is formed on the first spacer material 1200 to a substantially same thickness as those of the channels 113, 123. It is noted herein that the first spacer material 1200 and the ILD layer 1300 have a high etching selectivity therebetween.

Figure 13:
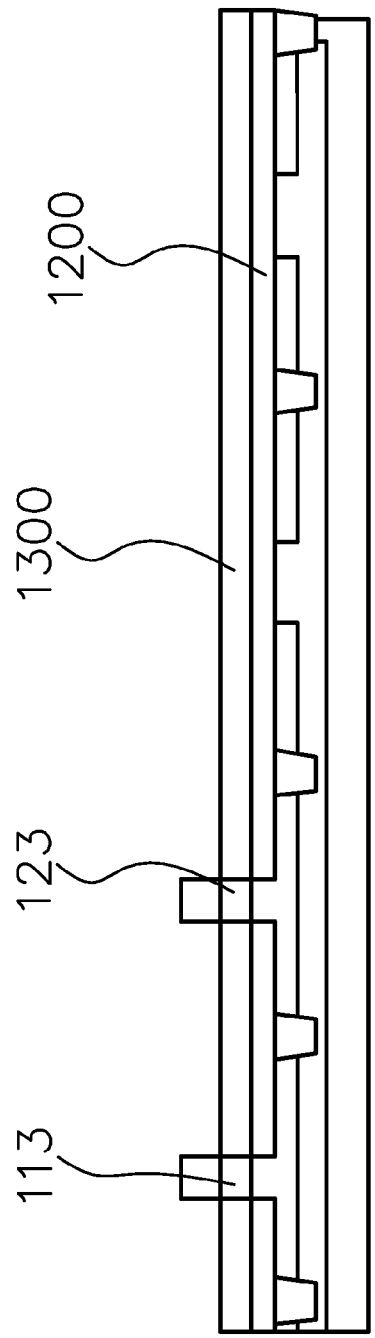
Figure 14:
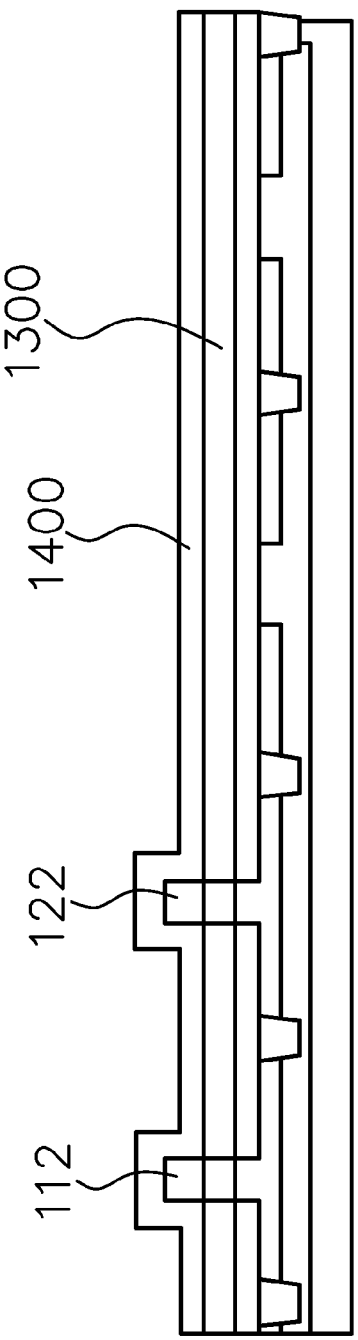

In FIG. 14, a second spacer material 1400 is formed over the structure of FIG. 13 in a conformal manner. That is, the second spacer material 1400 has a substantially uniform thickness throughout the structure. As a result, portions of the second spacer material 1400 disposed on the drains 112, 122, portions of the second spacer material 1400 disposed around the sides of the drains 112, 122, and portions of the second spacer material 1400 disposed on the ILD layer 1300 all have a substantially same thickness.

Figure 15:
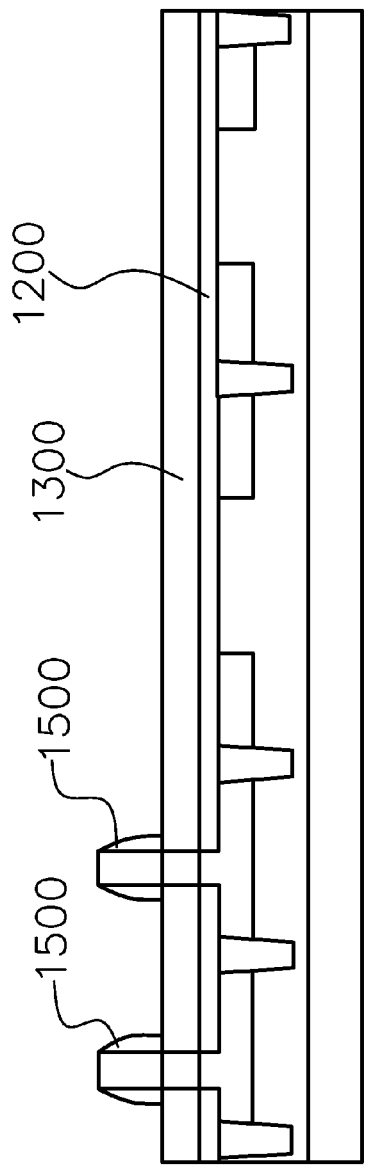

Next, referring to FIG. 15, the second spacer material 1400 is patterned and etched to form the remaining second spacer material 1500 that serves as the first and second spacers 116, 126 of the first and second transistors 110, 120, respectively.

Figure 16:
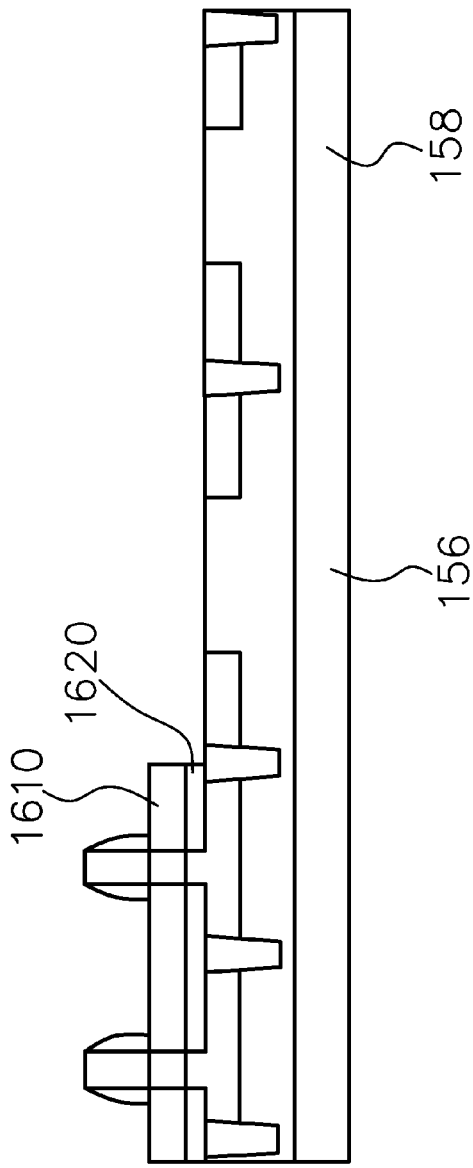
Figure 17:
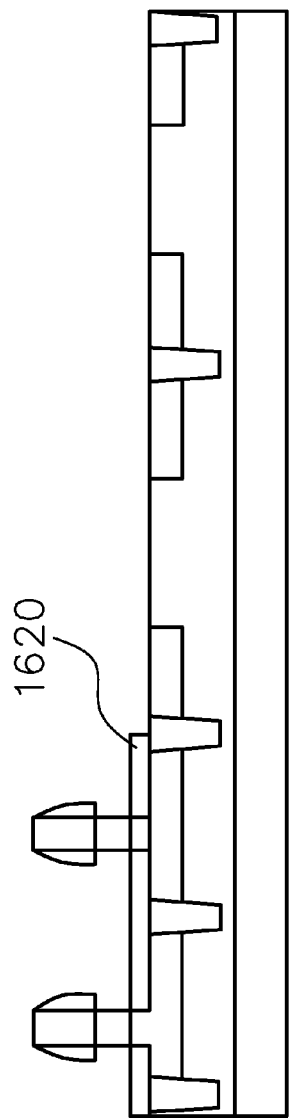

Next, the ILD layer 1300 is patterned, and is then etched, as well as the first spacer material 1200 thereunder, to form, as illustrated in FIG. 16, the remaining ILD layer 1610 and the remaining first spacer material 1620 and to expose the third and fourth active regions 156, 158 of the substrate 150. Next, the remaining ILD layer 1610 is removed, such as by an etching process, thereby resulting in the structure shown in FIG. 17.

Since there is a high etching selectivity between the ILD layer 1300 and the first spacer material 1200 as noted above, the remaining first spacer material 1620 is not affected by the removal of the remaining ILD layer 1610 thereabove.

Figure 18:
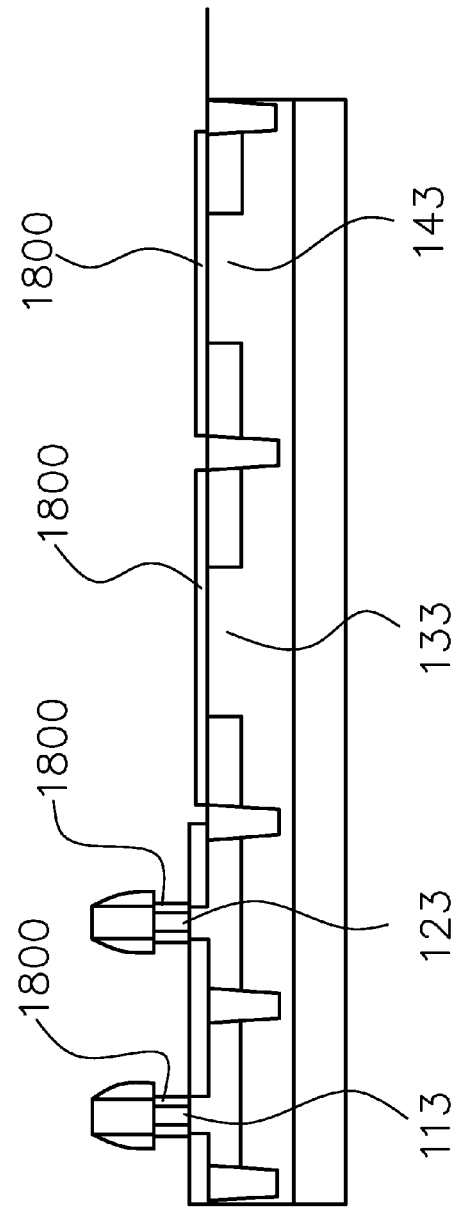

Next, referring to FIG. 18, a dielectric material 1800 is formed, such as by thermal oxidation, around the channel 113, around the channel 123, on the channel 133, and on the channel 143. As illustrated in FIG. 18, the formation of the dielectric material 1800 around the channel 113 and around the channel 123 cause the channels 113, 123 to oxidize partially and to be made thinner as a result. The dielectric material 1800 around the channel 123 serves as the gate oxide 124a of the gate stack 124 of the second transistor 120.

Figure 19:
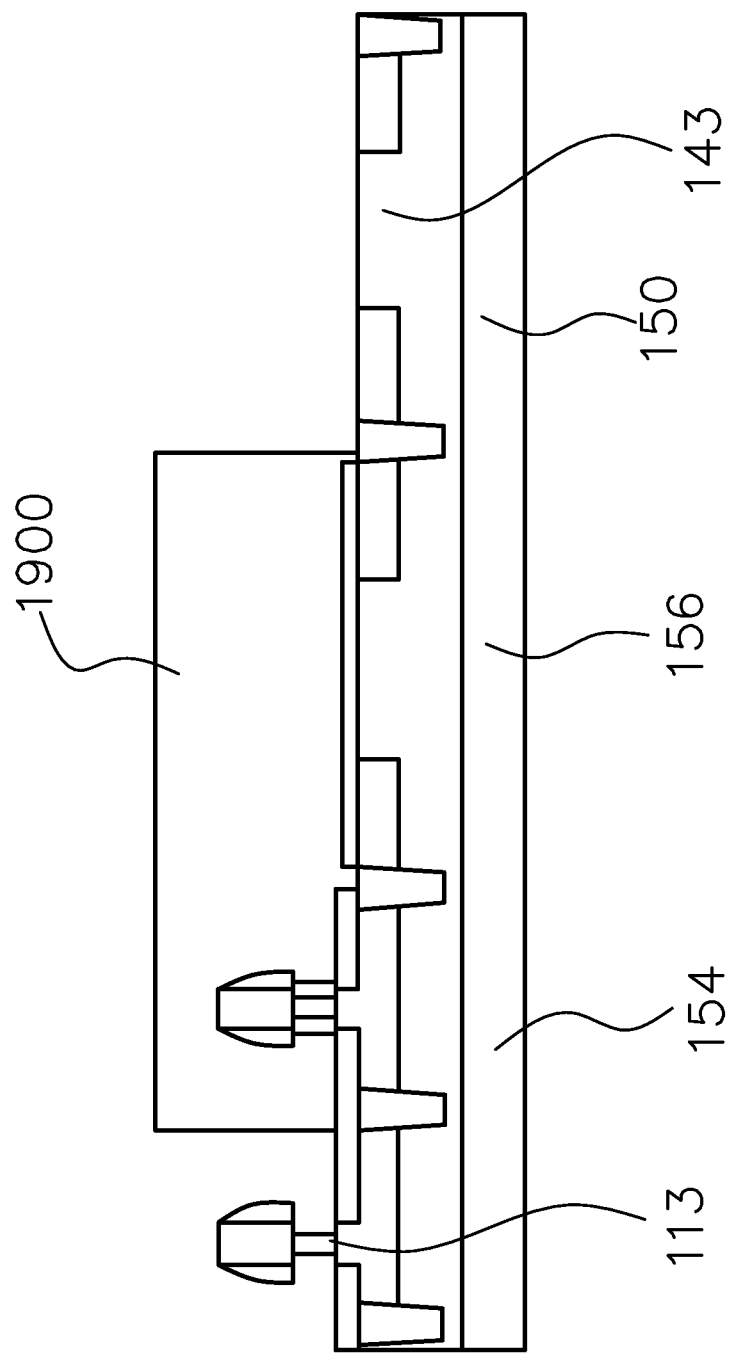

In FIG. 19, a protective layer 1900 is formed to cover the second and third active regions 154, 156 of the substrate 150, after which the dielectric material 1800 around the channel 113 and on the channel 143 are removed. Thereafter, the protective layer 1900 is removed.

Figure 20:
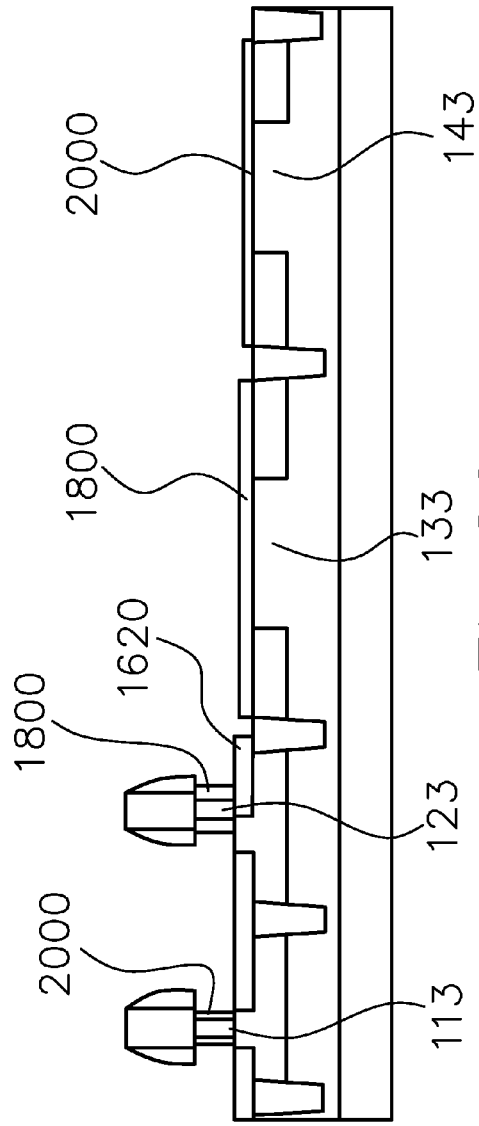

Next, referring to FIG. 20, another dielectric material 2000 is formed around the channel 113 and on the channel 143. The dielectric material 2000 around the channel 113 serves as the gate oxide 114a of the gate stack 114 of the first transistor 110.

Subsequently, a high-K dielectric material is formed on the remaining first spacer material 1620, the dielectric material 1800 around the channel 123 and on the channel 133, and the dielectric material 2000 around the channel 113 and on the channel 143. Next, a conductive material is formed on the high-K dielectric material.

Figure 21:
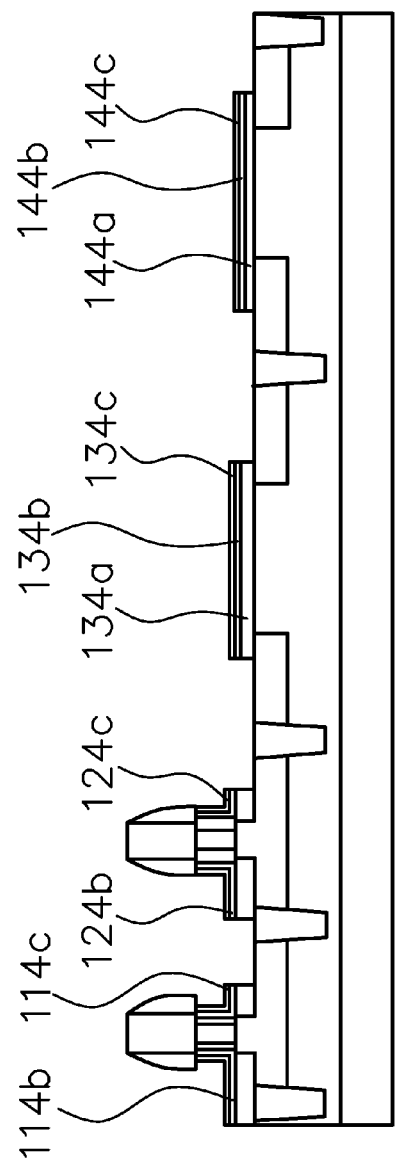

Next, portions of the conductive material, as well as the high-K dielectric material and the remaining spacer material 1620 thereunder, is removed (e.g., through a cutting process) to simultaneously form the gate oxides 134a, 144a, the high-K dielectrics 114b, 124b, 134b, 144b, and the gates 114c, 124c, 134c, 144c of the gate stacks 114, 124, 134, 144 of the transistors 110, 120, 130, 140, as illustrated in FIG. 21.

Thereafter, silicide metals are formed over the structure of FIG. 21, after which the resulting structure is annealed to react the silicide metals, whereby the reacted silicide metals form the source silicides 117, 127, 137, 147 and the drain silicides 118, 128, 138, 148 of the first, second, third, and fourth transistors 110, 120, 130, 140 as shown in FIG. 1. Next, the unreacted metals are removed.

Next, referring to FIG. 1, the insulation 180 is formed to cover the first, second, third, and fourth transistors 110, 120, 130 and 140.

Finally, still referring to FIG. 1, the contacts 190 are formed, for example, by forming contact openings, each of which extends through the insulation 180 and connects onto a respective one of the source silicides 117, 127, 137, 147, the drain silicides 118, 128, 138, 148, and the gates 114c, 124c, 134c, 144c, by filling the contact openings with a conductive layer and then by patterning and etching the conductive layer, thereby resulting in the semiconductor device 100.

It has thus been shown that that the example semiconductor device 100 includes a VGAA core transistor 110, a VGAA I/O transistor 120, and planar transistors 130, 140. Each of the VGAA core transistor 110 and VGAA I/O transistor 120 includes a source 111, 121, a drain 112, 122, a channel 113, 123 that extends in a substantially vertical direction and that interconnects the source 111, 121 and the drain 112, 122 thereof, and a gate stack 114, 124 that surrounds the channel 113, 123 thereof. Each of the planar transistors 130, 140 includes a source 131, 141, a drain 132, 142, a channel 133, 143 that extends in a substantially horizontal direction and that interconnects the source 131, 141 and the drain 132, 142 thereof, and a gate stack 134, 144 that is disposed on the channel 133, 143 thereof. The gate stack 114, 124, 134, 144 of each of the transistors 110, 120, 130, 140 includes a gate oxide 114a, 124a, 134a, 144a. The gate oxide 134a of the gate stack 134 of the planar transistor 130 has a substantially same thickness as the gate oxide 124a of the gate stack 124 of the VGAA I/O transistor 120 and has a length greater than that of the gate oxide 124a of the gate stack 124 of the VGAA I/O transistor 120. As such, the planar transistor 130 may be configured as an electrostatic discharge (ESD) protection circuit for the VGAA I/O transistor 120 to thereby protect the VGAA I/O transistor 120 from ESD-induced damages. The gate oxide 144a of the gate stack 144 of the planar transistor 140 has a substantially same thickness as the gate oxide 114a of the gate stack 114 of the VGAA core transistor 110 and has a length greater than that of the gate oxide 114a of the gate stack 114 of the VGAA core transistor 110. As such, the planar transistor 140 may be configured as a capacitor circuit for the VGAA core transistor 110 to thereby increase a gate input capacitance of the VGAA core transistor 110.

Further, as illustrated in the example process for fabricating the example semiconductor device 100, the sources 111, 121, 131, 141, the drains 112, 122, 132, 142, and the channels 113, 123, 133, 143 of the transistors 110, 120, 130, 140 are formed simultaneously, and the gate oxides 134a, 144a of the gate stacks 134, 144 of the transistors 130, 140, and the high-K dielectric 114b, 124b, 134b, 144b and the gates 114c, 124c, 134c, 144c of the gate stacks 114, 124, 134, 144 of the transistors 110, 120, 130, 140 are formed simultaneously.

In one embodiment, a semiconductor device includes a first transistor and a second transistor. The first transistor includes a channel that extends in a substantially vertical direction. The second transistor includes a channel that extends in a substantially horizontal direction.

In another embodiment, a semiconductor device includes a first transistor, a second transistor, a third transistor, and a fourth transistor. The first transistor includes a channel that extends in a substantially vertical direction, and a gate oxide that surrounds the channel thereof The second transistor includes a channel that extends in the vertical direction, and a gate oxide that surrounds the channel thereof and that has a thickness greater than that of the gate oxide of the first transistor. The third transistor includes a channel that extends in a substantially horizontal direction, and a gate oxide that is disposed on the channel thereof and that has a substantially same thickness as the gate oxide of the second transistor. The fourth transistor includes a channel that extends in the horizontal direction, and a gate oxide that is disposed on the channel thereof and that has a substantially same thickness as the gate oxide of the first transistor.

In yet another embodiment, a method of fabricating a semiconductor device includes: forming first and second transistors. The first transistor includes a channel that extends in a substantially vertical direction. The second transistor includes a channel that extends in a substantially horizontal direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first transistor including:
a channel that extends in a vertical direction,
a gate oxide consisting of a vertically-extending layer that surrounds the channel,
a high-K dielectric comprising (i) a vertically-extending layer that surrounds the gate oxide's vertically-extending layer and (ii) a horizontally-extending layer that projects outward from the high-K dielectric's vertically-extending layer, wherein the high-K dielectric's vertically-extending layer and horizontally-extending layer together form a pair of generally L-shaped cross sections along a substantially vertical plane,
a gate that includes (i) a vertically-extending layer that surrounds the high-K dielectric's vertically-extending layer and (ii) a horizontally-extending layer that projects outward from the gate's vertically-extending layer and disposed on the high-K dielectric's horizontally extending layer, wherein the gate's vertically-extending layer and horizontally-extending layer together form a pair of generally L-shaped cross sections along the substantially vertical plane,
a top S/D overlying a top surface of gate,
a bottom S/D having an inverted-T shape comprising (i) an upward projection and (ii) a horizontal projection projecting horizontally outward from the upward projection, wherein the channel projects upward from a top of the bottom S/D's upward projection,
a second transistor including:
a channel that extends in a horizontal direction,
a first S/D and a second S/D that are adjoined to horizontally-opposite sides of the second transistor's channel and that both lie in substantially the same plane of the horizontal projection of the first transistor's bottom S/D,
a horizontally-extending gate oxide overlying a top of the second transistor's channel,
a horizontally-extending high-K dielectric overlying the gate oxide, and
a horizontally-extending gate overlying the high-K dielectric,
a shallow trench isolation separating the first transistor's bottom S/D from the second transistor's first S/D.

2. The semiconductor device of claim 1, wherein the second transistor's gate oxide has a substantially same thickness as the gate oxide of the first transistor.

3. The semiconductor device of claim 1, wherein the second transistor's gate oxide has a length greater than that of the gate oxide of the first transistor.

4. The semiconductor device of claim 1, wherein the horizontal projection of the bottom S/D of the first transistor and the first S/D and the second S/D of the second transistor have a substantially same thickness.

5. The semiconductor device of claim 4, wherein the second transistor's gate has a substantially same thickness as the gate of the first transistor.

6. The semiconductor device of claim 5, wherein the second transistor's high-K dielectric has a substantially same thickness as the high-K dielectric of the first transistor.

7. The semiconductor device of claim 1, wherein the first and second transistors are spaced apart from each other in the horizontal direction.

8. The semiconductor device of claim 1, wherein the first transistor further includes:
   a gate contact projecting upward from the gate's horizontally-extending layer,
   a top silicide overlying the top S/D,
   a top S/D contact extending upward from the top silicide and through an insulation layer,
   a bottom S/D silicide overlying the bottom S/D's horizontal projection, and
   a bottom S/D contact extending upward from the bottom S/D silicide and through the insulation layer.

9. The semiconductor device of claim 1, wherein the second transistor further includes:
   a gate contact projecting upward from the gate and through an insulation layer,
   a first S/D silicide overlying the first S/D,
   a first S/D contact projecting upward from the first S/D silicide and through the insulation layer,
   a second S/D silicide overlying the second S/D, and
   a second S/D contact projecting upward from the second S/D silicide and through the insulation layer.

* * * * *